(12) United States Patent
Kijima et al.

(10) Patent No.: US 6,777,091 B2
(45) Date of Patent: Aug. 17, 2004

(54) SUBSTRATE WITH PHOTOCATALYTIC FILM AND METHOD FOR PRODUCING THE SAME

(75) Inventors: Yoshifumi Kijima, Osaka (JP); Toshiaki Anzaki, Osaka (JP)

(73) Assignee: Nippon Sheet Glass Co., Ltd., Osaka (JP)

( * ) Notice: Subject to any disclaimer, the term of this patent is extended or adjusted under 35 U.S.C. 154(b) by 0 days.

(21) Appl. No.: 10/220,714

(22) PCT Filed: Mar. 15, 2001

(86) PCT No.: PCT/JP01/02037

§ 371 (c)(1),
(2), (4) Date: Sep. 3, 2002

(87) PCT Pub. No.: WO01/71055

PCT Pub. Date: Sep. 27, 2001

(65) Prior Publication Data

US 2003/0064179 A1 Apr. 3, 2003

(30) Foreign Application Priority Data

Mar. 22, 2000 (JP) ........................................ 2000-079853

(51) Int. Cl.[7] ............................ B32B 17/06; B01J 23/00
(52) U.S. Cl. ........................ 428/428; 428/432; 428/688; 428/689; 428/701; 428/702; 502/242; 502/309; 502/349; 502/350; 106/286.1; 106/286.4; 106/286.8; 427/377; 427/376.2
(58) Field of Search .............................. 428/428, 423, 428/432, 688, 689, 702; 502/242, 208, 309, 349, 358; 106/286.1, 286.4, 286.8; 427/377, 376.2

(56) References Cited

U.S. PATENT DOCUMENTS 3,808,044 A * 4/1974 Hofmann .................. 427/374.6
6,013,372 A 1/2000 Hayakawa et al.
6,054,227 A * 4/2000 Greenberg et al. .......... 428/701
6,055,088 A * 4/2000 Fix et al. .................... 359/265
6,103,363 A * 8/2000 Boire et al. ................. 428/325
6,368,668 B1 * 4/2002 Kobayashi et al. ...... 427/376.2
2001/0008696 A1 7/2001 Takahama et al.

FOREIGN PATENT DOCUMENTS

| EP | 0 590 447 | 4/1994 |
| JP | 1-231367 | 9/1989 |
| JP | 9-129012 | 5/1997 |
| JP | 10-146251 | 6/1998 |
| JP | 10-152396 | 6/1998 |
| JP | 10-278165 | 10/1998 |
| JP | 10-310653 | 11/1998 |
| WO | WO 97/25450 | 7/1997 |
| WO | WO 01/10552 A1 | 2/2001 |

OTHER PUBLICATIONS

Edelman et al. "E–gun sputtered and reactive ion sputtered $TiO_2$ thin films for gas sensors". *Electron Technology*, vol. 33, No. 1/2, pp. 89–107, 2000.
Amor et al. "Structural and optical properties of sputtered Titania films". *Materials Science and Engineering*, vol. 47, No. 2, pp. 110–118, Jun. 15, 1997.
Wang et al. "Effects of substrate temperature on the microstructure and photocatalytic reactivity of $TiO_2$ films". *Journal of Materials Science*, vol. 9, No. 5, pp. 527–530, Oct. 1998.
Anand et al. "Characterstics of radio frequency sputtered titanium dioxide films". 133rd meeting of the Electrochemical Society, Abstracts, Boston, MA, May 5–9, 1968.

* cited by examiner

Primary Examiner—Deborah Jones
Assistant Examiner—G. Blackwell-Rudasill
(74) Attorney, Agent, or Firm—Merchant & Gould P.C.

(57) ABSTRACT

The sheet resistance of titanium oxide film can be controlled in $10^9$ to $10^{13}$ Ω/□ by coating a titanium oxide film on a substrate by sputtering a target containing metallic titanium under an atmosphere at reduced pressure and then subjecting the film to heat treatment under and oxidizing, inert or reducing atmosphere, depending on the oxygen-deficient state of the film. It is possible that a small amount of niobium oxide is contained in the titanium oxide, or a niobium oxide film is provided as an underlying film.

8 Claims, 3 Drawing Sheets

SUBSTRATE WITH PHOTOCATALYTIC FILM AND METHOD FOR PRODUCING THE SAME

TECHNICAL FIELD

The present invention relates to a substrate on which a photocatalytic film having titanium oxide as a primary component is coated and a method for producing the same.

BACKGROUND ART

Substrates (articles) on whose surface a photocatalytic film is coated are widely used in, for example, windowpanes of buildings requiring fouling resistance, antibacterial property, and the like, indicator panels of electronic displaying instruments, casings of portable equipment, sanitary installations, frames of medical facilities, apparatus in the field of biotechnology such as DNA analysis and the like. The substrates on which a photocatalytic film containing titanium oxide as a primary component is coated are widely used in order to provide fouling resistance, antibacterial property, deodorizing function and the like to the such substrate surfaces.

Such photocatalytic films are coated by sputtering processes, and it is known that crystalline titanium dioxide films are preferable as such films in order to increase the photocatalytic activity of the photocatalytic films and make the fouling resistance performance better. However, in order to coat on a substrate a titanium dioxide film having good crystallinity, there is a problem of requiring heating the substrate to be coated at a temperature of 300° C. or more (Japanese Patent Laid-Open No. 10-1 52396).

In addition, there are known photocatalytic films prepared by irradiating a metallic titanium target with electron beams in an oxidizing atmosphere to coat an amorphous titania (non-crystalline titanium oxide) film on a glass plate, followed by calcination it at a temperature of 400 to 500° C. or more to form rutile-typed titania crystal (Japanese Patent Laid-Open No. 10-146251) and processes for photocatalytic films of crystalline titanium dioxide prepared by coating a metallic titanium or titanium oxide film on a glass plate by sputtering, followed by calcination it (Japanese Patent Laid-Open Nos. 10-278165 and 10-146251).

However, coating a photocatalytic film on a substrate heated at high temperatures by a sputtering process that are carried out in an atmosphere at reduced pressure causes releasing impurity gases such as moisture from the inner wall of the heated decompressing container (film-forming chamber container), and therefore has technical problems of being difficult in making reduced-pressure atmosphere good purity. In other words, in order to make reduced-pressure atmosphere good purity necessary to obtain a good photocatalytic activity, a vacuum exhausting system in a big way is required to sputtered-film-forming equipment, causing problems of increasing the cost of coating a photocatalytic film.

In addition, methods of crystallizing the above-mentioned amorphous titanium oxide and metallic titanium films in the air by heating and calcination have problems of poor productivity because of requiring calcination for a sufficient period of time at high temperatures (heat treatment) and expensive calcination equipment and elongating the heating cycle. Furthermore, there are problems of not obtaining readily photocatalytic films with good reproductivity.

DISCLOSURE OF THE INVENTION

A subject of the present invention is to solve the above-mentioned problems. A first purpose of the present invention is to provide a substrate on which a photocatalytic film having high photocatalytic activity is coated. A second purpose of the present invention is to provide a method capable of producing a substrate with such photocatalytic film without the need of heating at a high temperature in the film-coating step.

The present invention have been achieved by finding that when a titanium oxide film coated on the surface of a substrate by a sputtering process which is amorphous or at a state where the crystallinity has not sufficiently developed is heated and crystallized with controlling the oxygen-defect state of the film, it can be formed to a photocatalytic film containing titanium oxide as a primary component and having good photocatalytic activity.

One embodiment of the invention is a substrate with photocatalytic film comprising a substrate and a photocatalytic film coated on the substrate, wherein said photocatalytic film is coated on said substrate by sputtering a target containing titanium in an atmosphere at reduced pressure, contains titanium oxide as a primary component, and has a sheet resistance of $10^9$ to $10^{13}$ $\Omega/\square$.

The photocatalytic film having a titanium oxide film as a primary component according to the present invention is a crystalline titanium dioxide film containing anatase-typed crystal and characterized by a controlled oxygen-defect state of the film. In the case that a titanium dioxide film contains an almost stoichiometric amount of titanium and oxygen, its sheet resistance is at a level of $10^{15}$ $\Omega/\square$ or more. By contrast, the photocatalytic film according to the present invention is formed to an oxygen-defect state, whereby the sheet resistance of the film can be controlled in the range of $10^9$ to $10^{13}$ $\Omega/\square$.

Although the reason is not clear why the degree of the photocatalytic activity of a titanium oxide film depends on the oxygen-defect state of the titanium dioxide film, it is likely that the oxygen deficiency can be contributed to the energy level of the crystalline titanium oxide film.

The relationship between the photocatalytic activity and the sheet resistance of the titanium dioxide film indicates that when the sheet resistance is more than $10^{13}$ $\Omega/\square$ and the amount of oxygen deficiency is reduced, the photocatalytic activity is decreased. By contrast, when the sheet resistance is less than $10^9$ $\Omega/\square$, that is, when the oxygen deficiency is present at a more amount than that indicated by $10^9$ $\Omega/\square$ sheet resistance (the oxygen in the titanium oxide film is reduced to a smaller amount than that corresponding to the stoichiometric amount of titanium dioxide), the photocatalytic activity is reduced, if anything. The titanium oxide photocatalytic film according to the present invention has a sheet resistance controlled within the range of $10^9$ to $10^{13}$ $\Omega/\square$, and therefore has high photocatalytic activity.

The photocatalytic film according to the present invention is coated on a substrate by a sputtering process. The film is coated by employing metallic titanium or a metal having metallic titanium as a primary component as a target, and sputtering it in reduced pressure atmosphere comprising a mixed gas of an inert gas such as argon and oxygen or oxygen gas alone. The controlling of the oxygen deficiency of the titanium oxide film can be achieved by controlling the total pressure of the atmosphere gas and the partial pressure of oxygen during sputtering the target.

Also, the photocatalytic film according to the present invention can be coated by employing, as a target, titanium dioxide that has the stoichiometric composition or is at a state where the oxygen is somewhat more defect than the stoichiometric amount (sometimes referred to as titanium suboxide), and sputtering it in reduced pressure atmosphere comprising a mixed gas of an inert gas such as argon and oxygen or oxygen gas alone. The controlling of the oxygen deficiency in the titanium oxide film can be achieved by controlling the total pressure of the atmosphere gas and the partial pressure of oxygen during sputtering the target.

The sheet resistance of the photocatalytic film may be controlled so as to be within $10^9$ to $10^{13}$ $\Omega/\square$ by heat treatment after coating on the substrate.

In the present invention, the sheet resistance can be controlled such that the titanium dioxide film immediately after coating has the resistance range described above, and preferably is controlled in combination with the resistance controlling during coating and the resistance controlling by heat treatment after coating. This can result in the formation of a photocatalytic film having a higher surface hardness.

The heat treatment is carried out such that the contract angle of pure water on the surface of the photocatalytic film is 65° or less. The degree of the photocatalytic activity and practical performance are affected by the hydrophilicity of the film surface. It is preferable that the heat treatment is carried out such that the sheet resistance of the photocatalytic film is controlled in the above-mentioned range and the hydrophilicity of the photocatalytic film is reduced. From this viewpoint, it is preferably that the contact angle of pure water on the surface of the photocatalytic film is 65° or less. In the present invention, the contact angle of pure water refers to a contact angle under the condition where the films are allowed to stand in a dark room for two weeks after the exposure of UV irradiation (the center wave-length of 360 nm, 3 mW/cm$^2$) for 30 min.

The photocatalytic film may contain, as a by-component, any one of niobium oxide, aluminum oxide, iron oxide and nickel oxide. Incorporating these metals into the crystal lattice of titanium oxide can change the energy level of the crystal lattice, thereby resulting in the formation of a film having higher photocatalytic activity.

A niobium oxide film, aluminum oxide film, iron oxide film or nickel oxide film may be interposed as an underlying film between the substrate and the photocatalytic film. For example, in the case that a niobium oxide film is the underlying film, a photocatalytic film obtained by laminating and coating a niobium oxide film and a titanium oxide film on the substrate and subsequently heat treating has the niobium diffused from the interface between the titanium oxide and niobium oxide films into the titanium oxide film, thereby resulting in higher photocatalytic activity. A niobium oxide film is preferable among these oxide films.

Substrates to be employed in the present invention are not limited to specified materials and shapes. Any material can be used which does not deteriorate during coating a film by sputtering, and on optionally heating the substrate and on the heat treatment after coating. For example, substrates of glass, ceramic, resin or metal can be used. In particular, for glass plate containing alkali components such as soda lime silicate glass plate, the underlying film can prevent the decrease in the photocatalytic activity by diffusing the alkali components of the glass into the titanium oxide photocatalytic film.

The invention includes a method for producing a substrate with photocatalytic film, comprising the steps of coating a photocatalytic film containing titanium oxide as a primary component on a substrate by sputtering a target containing titanium in an atmosphere at reduced pressure, and subjecting the photocatalytic film after said coating to heat treatment.

As a sputtering target used for sputtering in the present invention, sintered molded articles of fine powder of metallic titanium or titanium dioxide can be utilized. In the case of employing metallic titanium as the target, it is possible to increase the photocatalytic activity to a higher extent by incorporating a small amount of niobium, iron, aluminum, nickel or the like and changing the energy level of the resulting titanium dioxide photocatalytic film. In the case of employing sintered articles of titanium oxide as the target, it is possible to use sintered articles of fine powder of titanium dioxide, sintered molded articles of fine powder of titanium suboxide (having a somewhat smaller O/Ti ratio than that of titanium dioxide).

An oxygen atmosphere, a mixed gas atmosphere of oxygen and an inert gas such as argon and the like can be employed as the atmosphere at reduce pressure during coating the film. This is intended for the crystallization of the film coated on the substrate and the increase in the crystallinity of the film, and results in the controlling of the oxygen-defect state, as expressed by the sheet resistance, in the range of $10^9$ to $10^{13}$ $\Omega/\square$.

In the case that the sheet resistance of the coated film is more than $10^{13}$ $\Omega/\square$, the heat treatment is carried out in an inert or reducing atmosphere.

For the films having a sheet resistance after coating of more than $10^{13}$ $\Omega/\square$, the increase in the photocatalytic activity can be achieved by increasing the oxygen deficiency in the films. To this purpose, the atmosphere during the heat treatment is an inert or reducing atmosphere. The sheet resistance of the photocatalytic film is decreased to a value of $10^9$ $\Omega/\square$ or more.

The inert atmosphere is exemplified by a nitrogen-gas atmosphere, and an inert-gas atmosphere such as argon, or a vacuumed space where the pressure is reduced to a sufficient degree. An atmosphere containing hydrogen gas can be employed as the reducing atmosphere.

It is likely that the increase of the oxygen deficiency in the film are effected by drawing the oxygen having unstable or weak linkage with titanium from the inside of the film to the outside. In order to increase the photocatalytic activity, it is preferable that the sheet resistance value of the film is decreased to $10^9$ $\Omega/\square$ or more, and more preferable to $10^{10}$ $\Omega/\square$ or more.

In the case that the sheet [surface] resistance of the photocatalytic film coated on by a sputtering process is less than $10^9$ $\Omega/\square$, the heat treatment is carried out under an oxidizing atmosphere.

The sheet resistance of the film of less than $10^9$ $\Omega/\square$ indicates that the film is rich in oxygen deficiency therein and has a small photocatalytic activity. In this case, the photocatalytic activity can be increased by decreasing the amount of the oxygen deficiency in the film, that is, by increasing a sheet resistance value corresponding to the amount of the oxygen deficiency. The oxidizing atmosphere employed can be an atmosphere containing oxygen or ozone, and the heat treatment in the air is most preferable from an economical viewpoint. The sheet resistance value of the photocatalytic film is increased to $10^{13}$ $\Omega/\square$ or less.

It is preferable that the sheet [surface] resistance value of the film is increased to $10^9$ $\Omega/\square$ or more, and more preferable to $10^{10}$ $\Omega/\square$ or more, in order that the oxygen deficiency in the film is disappeared and the photocatalytic activity is increased.

The heating temperature in the heat treatment step is from 200 to 350° C. It is preferable that the heating temperature is from 200 to 300° C.

It is possible to increase the degradation ratio of triolein of the photocatalytic film and the hydrophilicity of the film surface.

The sputtering target may contain[s] any one of niobium, aluminum, iron and nickel as a by-component. It is possible to contain more than one by-component.

It is preferable that in the case that a target to be used is a metallic target, these metals are contained at 0.1 to 3% by weight of the metallic titanium. The photocatalytic film obtained by sputtering such a metallic target in an oxygen-containing atmosphere has the oxygen-defect state that can be controlled by heat treatment in a similar way to as in the single composition of titanium oxide.

The method may further comprise the step of coating any one of niobium oxide film, aluminum oxide film, iron oxide film and nickel oxide film on the substrate by sputtering a target containing any one of niobium, aluminum, iron and nickel in an atmosphere at reduced pressure, before coating the photocatalytic film containing titanium oxide as a primary component.

For example, in the case of employing a niobium oxide film, a laminate of the niobium oxide and titanium oxide films laminated on the substrate has the niobium diffused into the titanium oxide film by the heat treatment, resulting in affecting the energy level of the photocatalytic film, and thus improving the photocatalytic activity. It is preferable that the substrate temperature is less than 200° C. during coating the photocatalytic film on the substrate by sputtering.

BEST MODE OF CARRYING OUT THE INVENTION

Figure 1:
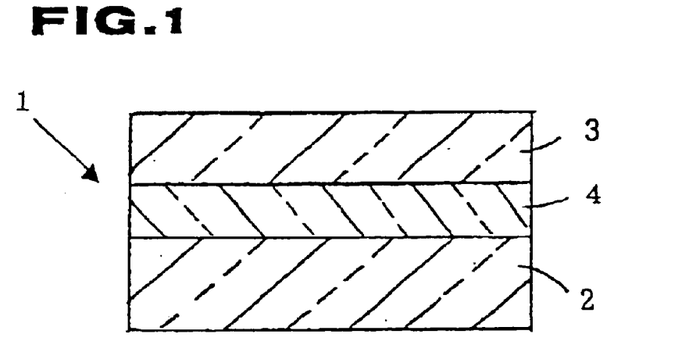
FIG. 1 shows a cross-sectional view of one example of the substrate with photocatalytic film according to the present invention.
Figure 2:
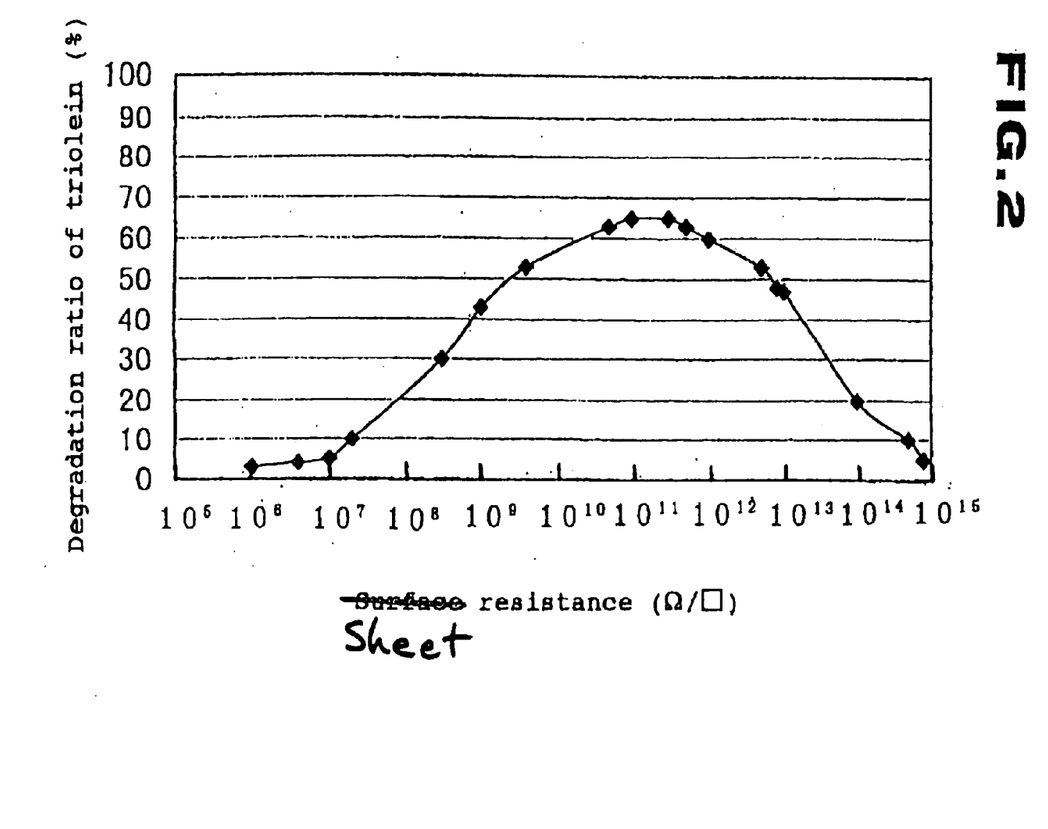
FIG. 2 shows a graph illustrating the relationship between the degradation ratio of triolein and the sheet resistance of the titanium oxide photocatalytic film.
Figure 3:
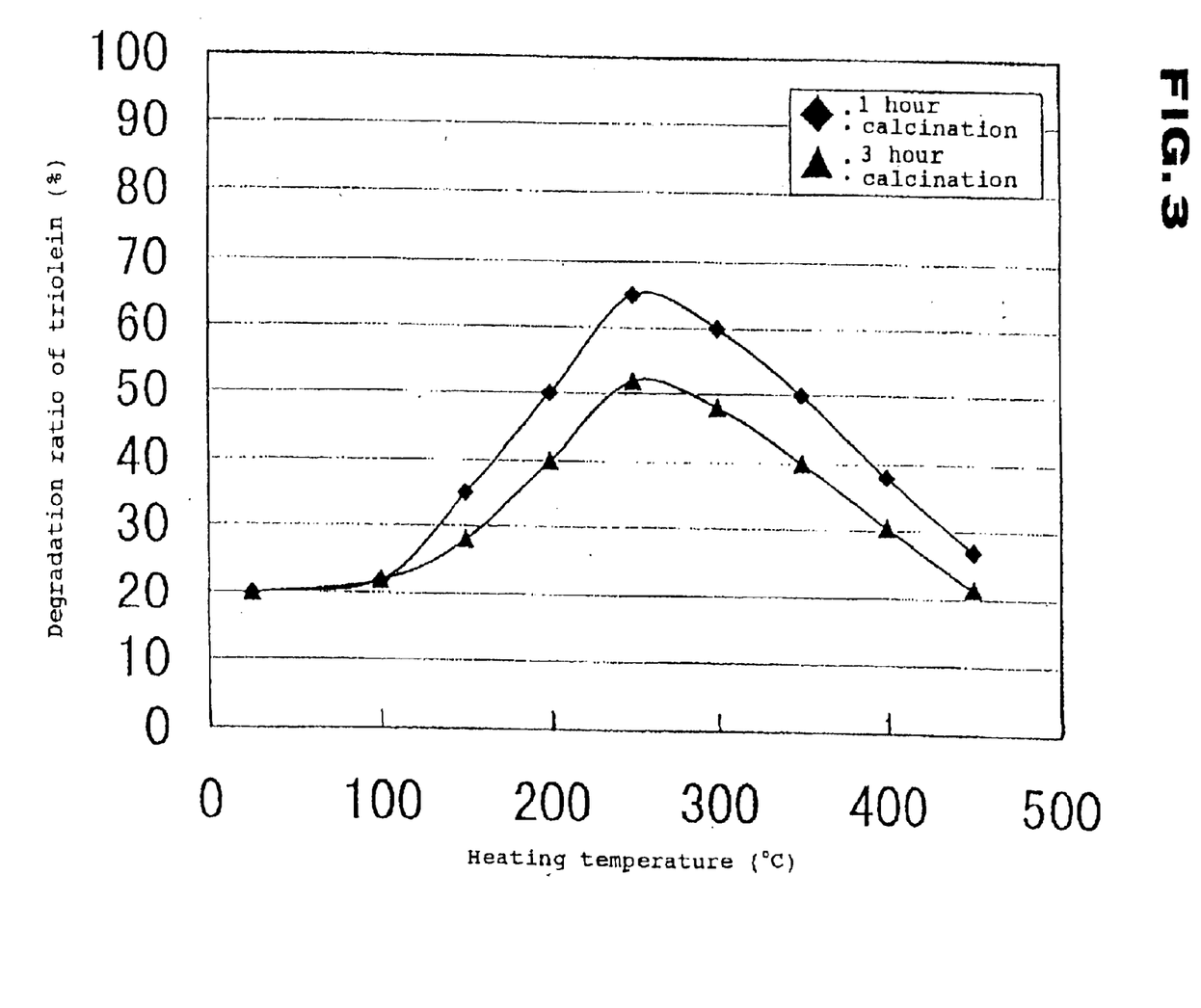
FIG. 3 shows a graph showing effects of the heat treatment temperature non the degradation ratio of triolein.
Figure 4:
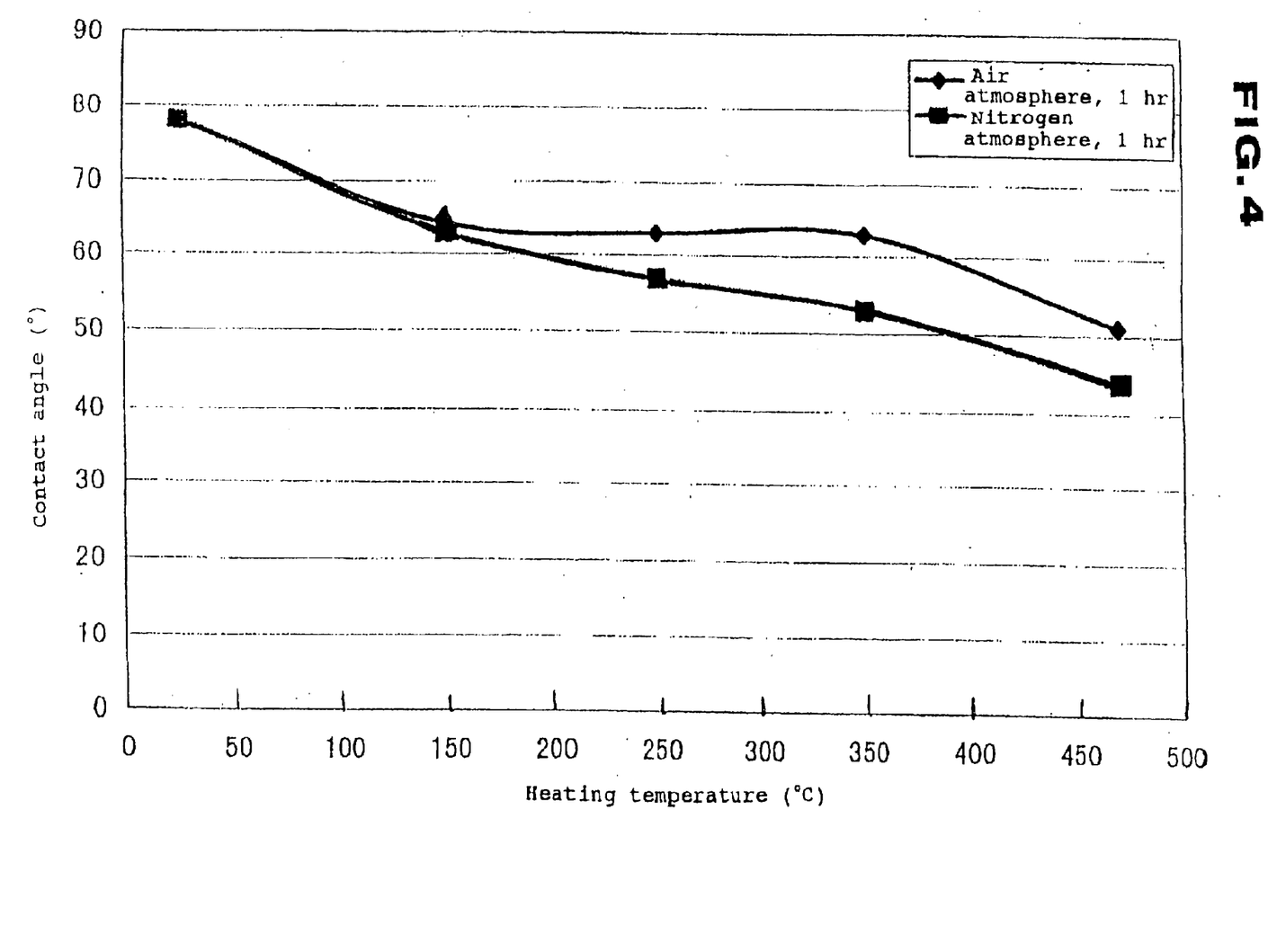
FIG. 4 shows a graph showing effects of the heat treatment temperature on the contact angle of water on the photocatalytic film surface.

Embodiments of the present invention will be described as follows. FIG. 1 shows a cross-sectional view of one example of the substrate with photocatalytic film according to the present invention, wherein the substrate with photocatalytic film 1 has a niobium oxide underlying film 4 and a titanium oxide photocatalytic film 3 on the film 4, the underlying and photocatalytic films being laminated and coated on the surface of a glass plate 2. FIG. 2 shows a graph illustrating the relationship between the photocatalytic activity and the sheet [surface] resistance of the titanium oxide photocatalytic film. FIG. 3 shows a graph illustrating effects of the heat treatment temperature on the photocatalytic activity. FIG. 4 shows a graph illustrating effects of the heat treatment temperature on the photocatalytic film hydrophilicity.

As a sputtered-film-forming equipment for coating the photocatalytic film of the present invention on a substrate, known sputtered-film-forming equipment can be used which has a mechanism allowing argon and oxygen at a controlled flow rate to be introduced into the film forming chamber and the function of vacuuming the film forming chamber by the vacuum pump and of stably keeping an atmosphere at a given reduced pressure.

For processes for generating glow discharge to sputter a target can be used known processes. That is, it is possible to use known processes such as direct current sputtering processes, high frequency sputtering processes, and PMS (Pulse Magnetron Sputtering) process in which sputtering is carried out while applying the voltage to cathodes arranged side by side with alternately inverting the polarity of the applied voltage and removing charges charged on the target surface.

The following describes the photocatalytic film according to the present invention with the relationship between the atmosphere gas composition of mixed gasses consisting of oxygen and argon and the oxygen deficiency in the resulting film when the total pressure of the atmosphere during sputtering, usually employed by the Pulse Magnetron Sputtering process, is set to 0.4 Pa. A film after coating which can be subjected to heat treatment under an oxidizing atmosphere to increase the photocatalytic activity is referred to "an oxygen-deficient film" hereinafter, in the sense that the oxygen defect is abundant. On the other hand, a film immediately after coating which can be subjected to reductive heat treatment under an inert or reducing atmosphere to increase the photocatalytic activity is to be referred to "an oxygen-rich film" hereinafter, since the oxygen defect is at a small amount, and the oxygen is contained to a relatively high extent, as opposed to the above-mentioned oxygen-deficient film.

(1) In the Case of Employing Titanium-Metal-Based Targets

For films immediately after coating, films having a various range of the oxygen content in the film are coated, such as from a titanium oxide film having an almost stoichiometric composition to an oxygen-deficient film that is relatively rich in the oxygen defect. In order to carry out sputtering in a reactive manner with oxygen, it is preferable that the oxygen of the atmosphere usually is contained at 60 to 65% by volume or more. The oxygen-rich film according to the present invention can be obtained under the atmosphere containing about 80% or more oxygen. On the other hand, when the oxygen content is 70 to 75% by volume or less, an oxygen-deficient film is formed, which in turn are subjected to oxidative heat treatment. The relationship between the oxygen-defect state of the film immediately after coating and the composition of the sputtering gas (oxygen content) is uniquely determined by no means, and depends on the total pressure during sputtering, the coating speed (coating rate) of the reactive coating, and the presence of residual impurity gasses and other in the vacuum.

(2) In the Case of Employing Targets of Titanium Dioxide-Based Fine-Powder Sintered Articles A compressed target is applied to, for example, heat treatment t a temperature of 1300° C. or more under an inert atmosphere, resulting in the formation of a conductive titanium suboxide target, which becomes capable of sputtering by direct current glow discharge. In the case that a titanium oxide-base sintered target is used which is treated to such an extent that such a direct current sputtering is possible, a titanium dioxide film close to an almost stoichiometric composition is coated on a substrate. In this case, the oxygen of the atmosphere gas can be usually supplied as a minor component.

A film coated under the sputtering atmosphere having an oxygen content of 30 to 40% by volume is already an oxygen-rich films, which can have an increased photocatalytic activity by heat treating under an inert or reducing atmosphere after coating. By contrast, in the case of the oxygen being 4 to 5% by volume or less, the resulting film, is an oxygen-deficient film, which can be formed into a film having good Photocatalytic activity by oxidative heat treatment. The percent oxygen content of this atmosphere and the oxygen-defect state of the resulting film are uniquely determined by no means, because of depending on the coating rate and the total pressure, and in addition the amount of impurity gasses.

The substrate temperature during coating the photocatalytic film of the present invention on the substrate by sputtering is preferably less than 200° C. at which its crystallization does not take place to a great extent during coating. Usually, it is preferable to carry out at not more than 150° C. or at room temperature (the substrate is not heated).

The crystallization and controlling of the resistance of the coated films are carried out in the heat treatment step of the present invention. In order to carry out the crystallization and controlling of the resistance such that the photocatalytic activity is effectively increased, the heating temperature is preferably 150° C. or more. For the photocatalytic film coated by a sputtering process, this can result in the increase in the crystallization and the controlling of a predetermined sheet resistance for a short period. The temperature is preferably 200° C. or more, also from the viewpoint of increasing the hydrophilicity of the photocatalytic film surface. As pieced together from these viewpoints, the heat treatment temperature is preferably 200° C. or more.

At the heat treatment temperature of more than 400° C., further crystallization of the photocatalytic film takes place, but changes such as unusual crystal growth, and diffusion and segregation of do pants are brought about in the catalyst film, thus leading to the decrease in the photocatalytic activity, if anything. Therefore, the heat treatment temperature is preferably 350° C. or less, and more preferably 300° C. or less.

For atmospheres during the heat treatment, an oxygen containing atmosphere, for example, air and an ozone containing atmosphere, can be used when oxidative crystallization is carried out to increase the sheet resistance. On the other hand, in order that non-oxidative crystallization is carried out and the sheet resistance is controlled at an approximately same value or otherwise decreased, an atmosphere containing an inert gas such as nitrogen, argon, helium, neon, and a reducing atmosphere containing hydrogen (for example, a mixed gas of nitrogen and hydrogen, a hydrogen gas containing 5 to 50% by volume carbon monoxide, and others) can be used. In addition, as an atmosphere having the same effect as an inert atmosphere, an atmosphere at reduced pressure (vacuumed atmosphere) can be also used. In this case, there are advantages of allowing the photocatalytic film coated on a substrate by a sputtering process to be subjected to the heat treatment, as it is, without discontinuation under the vacuumed atmosphere in the sputtering apparatus.

The present invention will be described in detail by means of Examples and Comparative Examples as follows. The methods of coating a photocatalytic film and of heat treatment are set forth as follows.

Sputtering and Coating Conditions

A. Substrate

Float glass plates having 2 mm thickness and composed of soda lime silicate.

B. Coating of a Titanium Dioxide Film
1) Target
   (1) Metallic titanium, 99.99%, (referred to as Ti).
   (2) Metallic titanium containing 0.5% by weight of metallic niobium (referred to as TiNb).
   (3) Metallic titanium containing 0.5% by weight of metallic aluminum (referred to as TiAl).
   (4) Metallic titanium containing 0.3% by weight of metallic iron (referred to as TiFe).
   (5) Metallic titanium containing 0.3% by weight of metallic nickel (referred to as TiNi).
   (6) An article obtained by compressing titanium dioxide fine powder in the air and heat treating under a nitrogen atmosphere to form a stat that is somewhat more deficient in oxygen than the stoichiometric composition of titanium dioxide (referred to as $TiO_x$ in Table).
   (7) A molded and processed article obtained by a similar treatment (6) of mixed powders of 99% by weight of titanium dioxide ($TiO_2$) fine powder and 1% by weight of niobium oxide ($Nb_2O_5$) fine powder (referred to as $TiNbO_y$ in Table).
2) Glow discharge: direct current sputtering
3) Atmosphere during sputtering
   The total pressure was adjusted to 0.4 Pa, and the atmosphere during sputtering was argon, oxygen, or a mixed gas of argon and oxygen.
4) Substrate temperature during sputtering
   Room temperature (without heating).

C. Coating of an Underlying Film of Niobium Oxide
1) Metallic niobium target: metallic niobium, 99.99% (referred to as Nb in Table).
2) Glow discharge: direct current sputtering.
3) Atmosphere during sputtering
   The total pressure was adjusted to 0.4 Pa, and the atmosphere during sputtering was 100% oxygen.
4) Substrate temperature during sputtering
   Room temperature (without heating).

D. Heat Treatment

The furnace used in the heat treatment is an electric furnace capable of vacuuming down to 0.4 Pa or less and allowing an atmosphere gas to enter the furnace through the inlet port to atmospheric pressure. The atmosphere gas was introduced into the furnace and substituted for the previous atmosphere for more than five minutes, and the atmosphere within the furnace was heated at a rate of rising temperature of 10° C/min. while further flowing the atmosphere gas into the furnace, so that the furnace was filled with the atmosphere at a predetermined heat treatment temperature, and then maintained for one hour. After that, the furnace was cooled gradually to room temperature with flowing the atmosphere gas. An oxidizing atmosphere (sheet resistance increasing treatment) employed air, an inert atmosphere (sheet resistance decreasing treatment) employed nitrogen, and an reducing atmosphere (sheet resistance decreasing treatment) employed a mixed gas of 75% by volume of nitrogen and 25% by volume of hydrogen.

Evaluation of Photocatalytic Films

A. Photocatalytic Activity

Triolein was coated on the surface of the films so as to be at 0.1 mg/cm$^2$, and irradiated with ultra violet radiation at a power of 3 mW/cm$^2$ for 46 hours. The degradation ratio of the coated triolein was calculated from weight measurements of the coated and remaining amounts.

B. Sheet resistance

In accordance with the JIS method (C2141).

C. Hydrophilicity the photocatalytic films were irradiated with UV (the central wavelength: 360 nm, 3 mW/cm$^2$) for 30 min. and the contact angle of pure water on the surface under the condition was measured where the film were allowed to stand in a dark room for two weeks.

D. Crystallinity of the Films

Determination was carried out on a Rigaku Denki X-ray diffractometer.

EXAMPLE 1

A sample was obtained by employing a sintered molded article of titanium suboxide as the target and coating a photocatalytic film having a thickness of 500 nm with a gas composition of 50% by volume of oxygen and 50% by volume of argon, the sheet resistance of the resulting photocatalytic film was shown to have a high sheet resistance of $1\times10^{14}$ $\Omega/\square$ (Table 1). When this film was heat treated under the inert atmosphere, the sheet resistance was decreased to $1\times10^{13}$ $\Omega/\square$. It is likely that this decrease in the resistance (increase in the conductivity) is due to increasing electrons contributing to the conductivity by drawing the oxygen from the coated film and increasing the oxygen defect in the crystal of the titanium dioxide film, and due to increasing their mobility by the acceleration of the crystallization of the film. By measuring photocatalytic activity, the degradation ratio of triolein was 47%, which is a practically useful value for imparting fouling resistance and antibacterial property.

EXAMPLE 2

Sample 2 was prepared in a similar way as in Example 1, except that the atmosphere during the heat treatment was changed to the reducing atmosphere. A similar heat treatment of this photocatalytic film as in Example 1 resulted in decreasing the sheet resistance to $1\times10^{10}$ $\Omega/\square$, and the degradation ratio of triolein had a good value of 63%.

EXAMPLE 3

A photocatalytic film was coated on a glass plate in a similar way as in Example 1, except that metallic titanium was employed as a target and the atmosphere during sputtering was 90% by volume of oxygen. The sheet resistance immediately after coating was $1\times10^{14}$ $\Omega/\square$, whereas the heat treatment under the inert atmosphere decreased the sheet resistance to $5\times10^{12}$ $\Omega/\square$. The degradation ratio of this photocatalytic film had a high value of 53%.

EXAMPLE 4

A photocatalytic film was coated on a glass plate in a similar way as in Example 3, except that the oxygen of the atmosphere during sputtering was 70% by volume. The sheet resistance immediately after coating was $2\times10^{9}$ $\Omega/\square$, and it was estimated that this film is a film rich in oxygen defect. The heat treatment of this film under the oxidizing atmosphere increased the sheet resistance to $5\times10^{11}$ $\Omega/\square$, which means that the amount of the oxygen defect was decreased. The degradation ratio of triolein of this photocatalytic film had a high value of 60%.

EXAMPLE 5

A pholocatalytic film was coated on a glass plate in a similar way as in Example 1, except that the oxygen of the atmosphere during sputtering was 4% by volume and the heat treatment was carried out under the oxidizing atmosphere. This film had a small sheet [surface] resistance of $5\times10^{7}$ $\Omega/\square$ and was found to be a film having a large amount of the oxygen defect. When the oxidative crystallization of this film was carried out under the oxidizing atmosphere, the sheet resistance was increased by approximately three orders, to $4\times10^{10}$ $\Omega/\square$. By measuring the photocatalytic activity of this film, the degradation ratio of triolein was 60%.

TABLE 1

| Example | Target | Oxygen of the atmosphere during sputtering (%) | Sheet resistance immediately after coating ($\Omega/\square$) | Heat Treatment Atmosphere | Sheet Resistance ($\Omega/\square$) | Photocatalytic activity Degradation ratio of triolein (%) |
|---|---|---|---|---|---|---|
| (Example) | | | | | | |
| 1 | TiO$_x$ | 50 | $1 \times 10^{14}$ | inert | $1 \times 10^{13}$ | 47 |
| 2 | TiO$_x$ | 50 | $1 \times 10^{14}$ | reductive | $5 \times 10^{10}$ | 63 |
| 3 | Ti | 90 | $1 \times 10^{14}$ | inert | $5 \times 10^{12}$ | 53 |
| 4 | Ti | 70 | $2 \times 10^{9}$ | oxidative | $5 \times 10^{11}$ | 63 |
| 5 | TiO$_x$ | 4 | $5 \times 10^{7}$ | oxidative | $4 \times 10^{10}$ | 60 |
| 6 | Ti | 75 | $1 \times 10^{12}$ | inert | $1 \times 10^{10}$ | 55 |
| 7 | TiO$_x$ | 10 | $3 \times 10^{10}$ | oxidative | $4 \times 10^{12}$ | 53 |
| 8 | TiO$_x$ | 15 | $3 \times 10^{12}$ | inert | $7 \times 10^{11}$ | 65 |
| 9 | Ti | 95 | $4 \times 10^{14}$ | reductive | $3 \times 10^{11}$ | 65 |
| (Comparative Example) | | | | | | |
| 1 | Ti | 68 | $7 \times 10^{8}$ | inert | $5 \times 10^{7}$ | 5 |
| 2 | Ti | 80 | $1 \times 10^{13}$ | oxidative | $1 \times 10^{14}$ | 20 |
| 3 | TiO$_x$ | 50 | $1 \times 10^{14}$ | oxidative | $1 \times 10^{15}$ | 5 |
| 4 | TiO$_x$ | 4 | $5 \times 10^{7}$ | inert | $4 \times 10^{6}$ | 1–3 |
| 5 | TiO$_x$ | 10 | $3 \times 10^{10}$ | inert | $3 \times 10^{8}$ | 30 |
| 6 | Ti | 100 | $7 \times 10^{14}$ | not applied | $7 \times 10^{14}$ | 5 |

EXAMPLE 6

A sample in which a photocatalytic film was coated on a glass plate in a similar way as in Example 3 was produced, except that the oxygen content of the atmosphere during sputtering was changed. The photocatalytic film of this sample had a sheet resistance of $1\times10^{12}$ $\Omega/\square$ and a high degradation ratio of triolein of 57% for the film immediately after coating. When this photocatalytic film was heat treated under the inert gas atmosphere, the sheet resistance was decreased by approximately two orders, to $1\times10^{10}$ $\Omega/\square$, but had an approximately same photocatalytic activity of 55%. From these results, it has been found that even if the heat treatment is not applied, the controlling of the sheet resistance of the titanium oxide film could produce a film having good photocatalytic activity.

EXAMPLE 7

A sample in which a photocatalytic film was coated on a glass plate as in a similar way as in Example 5 was produced, except that the oxygen content of the atmosphere during sputtering was changed. Evaluation results of the photocatalytic film of this sample are shown in Table 1.

EXAMPLE 8

A sample in which a photocatalytic film was coated on a glass plate as in a similar way as in Example 1 was produced, except that the oxygen content was changed during sputtering. Evaluation results of the photocatalytic film of this sample are shown in Table 1.

EXAMPLE 9

A titanium oxide film having a thickness of 500 nm was coated on a glass plate by employing metallic titanium as the target and 95% by volume of oxygen as the atmosphere gas during sputtering. A photocatalytic film of this sample was obtained by heat treating this film under the reducing atmosphere. The sheet resistance of the film immediately after coating was $4\times10^{14}$ $\Omega/\square$, whereas the heat treatment under the reducing atmosphere resulted in the decrease to $3\times10^{11}$ $\Omega/\square$ by approximately three orders. This photocatalytic film had a high degradation ratio of 65%.

COMPARATIVE EXAMPLE 1

Corresponding to Example 3

A photocatalytic film was coated on a glass plate in the conditions shown in Table 1. The sheet resistance of this film was $7\times10^{8}$ $\Omega/\square$. When this film was heat treated under the reducing atmosphere, the sheet resistance was decreased by approximately one order, to $5\times10^{7}$ $\Omega/\square$, and a film having an extremely abundant amount of the oxygen defect was formed. This film had a small degradation ratio of triolein of 5%, and was found to have practically poor usefulness.

COMPARATIVE EXAMPLE 2

Corresponding to Example 4

A photocatalytic film was coated on a glass plate in the conditions shown in Table 1. The sheet resistance of this film was $1\times10^{13}$ $\Omega/\square$. When this film was heat treated under the oxidizing atmosphere, the sheet [surface] resistance was increased by approximately one order, to $1\times10^{14}$ $\Omega/\square$ and the amount of the oxygen defect was decreased. The degradation ratio of triolein of this film was decreased to 20%.

COMPARATIVE EXAMPLE 3

Corresponding to Example 5

A photocatalytic film was coated on a glass plate in the conditions shown in Table 1. The sheet resistance of this film was $1\times10^{14}$ $\Omega/\square$. When this film was heat treated under the oxidizing atmosphere, the sheet resistance was increased by one order, to $1\times10^{15}$ $\Omega/\square$ and a film having a smaller amount of the oxygen defect was formed, compared with the sample of Comparative Example 2. This film had a much smaller degradation ratio of triolein of 5%, than that of the sample of Comparative Example 2.

COMPARATIVE EXAMPLE 4

Corresponding to Example 1

A photocatalytic film was coated on a glass plate in the conditions shown in Table 1. The sheet resistance of this film was $5\times10^{7}$ $\Omega/\square$. When this film was heat treated under the inner atmosphere, the sheet resistance was decreased to $4\times10^{6}$ $\Omega/\square$, which is approximately one order smaller than before the heat treatment. This sample was a sample having a larger amount of the oxygen defect, compared with the sample of Example 2. This film had an extremely small degradation ratio of triolein of 1 to 3%.

COMPARATIVE EXAMPLE 5

Corresponding to Example 1

A photocatalytic film was coated on a glass plate in a similar way as in Example 7. The sheet resistance of this film was $3\times10^{10}$ $\Omega/\square$. When this film was heat treated under the inert atmosphere, the sheet resistance was decreased to $3\times10^{8}$ $\Omega/\square$, which was smaller than before the heat treatment. This sample had a film having a larger amount of the oxygen defect, compared with the sample of Example 7. This film has a degradation ratio of triolein of 30%.

COMPARATIVE EXAMPLE 6

Without Heat Treatment

A titanium oxide film was coated on a glass plate by employing metallic titanium as the target and 100% oxygen as the atmosphere during sputtering. This film has a degradation ratio of triolein of 5%, and was found to have little photocatalytic activity.

Since photocatalytic films shown in Table 1 were coated at room temperature, each of them had such a degree that little or weak diffraction peaks by the crystal were observed, whereas the heat treatment resulted in observed diffraction peaks by the crystal, from X-ray diffraction analysis. That is, it has been found that the heat treatment can bring about crystallization.

FIG. 2 is a plot wherein the sheet resistance of the films after the heat treatment is plotted on the abscissa axis and the degradation ratio of triolein on the ordinate axis for samples obtained in Table 1. It has been found from FIG. 2 that the degradation ratio of triolein can be increased by controlling the oxygen-defect state of the titanium oxide film such that the sheet resistance value of the photocatalytic film is $1\times10^{9}$ $\Omega/\square$ to $1\times10^{13}$ $\Omega/\square$, and more preferably $1\times10^{10}$ $\Omega/\square$ to $1\times10^{12}$ $\Omega/\square$.

EXAMPLE 10

Photocatalytic Activity and Heat Treatment Temperatures

For titanium oxide films coated on a glass plate at room temperature in a similar way as in Example 4, effects on the degradation ratio of triolein of temperatures and times of the heat treatment in the air were examined. The temperatures were at eight levels of 100° C., 150° C., 200° C., 250° C., 300° C., 350° C., 400° C., and 450° C., with two levels of 1 hour and 3 hours at each temperature. The results are shown in FIG. 3.

From FIG. 3, the degradation ratio of triolein had a maximum at a temperature of about 250° C. for both treating periods. In addition, the degradation ratio of triolein was increased in the temperature range of 150° C. to 300° C. for both treating periods. For the heat treatment at temperatures of 450° C. or higher, however, it has been found that the degradation ratio of triolein was decreased, if anything, to such a degree that the values were almost the same as those before heating. It is believed that enough oxidation takes place due to high temperatures, resulting in the oxygen defect exceeding an appropriate range. By contrast, when the heat treatment is carried out at 150 to 350° C., the crystallization can be achieved without decreasing the oxygen defect in the titanium oxide film.

EXAMPLE 11

Hydrophilicity and Heat Treatment Temperatures

For titanium oxide films coated on a glass plate at room temperature in the same way as in Example 4, effects of heating temperatures on the contact angle of pure water on the surface of the photocatalytic films were determined when the heat treatment was carried out under the air and the nitrogen atmosphere for one hour, respectively. Results are shown in FIG. 4, in which the heat treatment temperatures were at four levels of 150° C., 250° C., 350° C., and 450° C.

The contact angle of water on the surface of the photocatalytic film before the heat treatment was 78°. When the heat treatment was carried out under the air, at heat treating temperatures of up to 150° C., with the increasing temperature, the contact angle of water was monotonously decreased to 63° and the hydrophilicity was increased. When the heat treating temperature was further increased up to 350° C., the contact angle was not decreased to a great extent and the hydrophilicity was not improved. At temperatures of more than 350° C., the hydrophilicity was slightly increased (the contact angle was decreased). On the other hand, in the case of the nitrogen atmosphere, the hydrophilicity was monotonously increased as the heat treatment temperature was increased. As understood from FIGS. 3 and 4, it is preferable that the heat treatment temperature is in the range of 200° C. to 350° C. in order to increase the photocatalytic activity and effectively the hydrophilicity.

EXAMPLES 12 AND 13

Experiments of Adding Niobium Oxide Impurity

A photocatalytic film containing titanium oxide as a primary component was coated on a glass plate and heat treated under the conditions shown in Table 2 employing a sintered molded article of mixed powders of titanium oxide and niobium oxide as the target. Results are shown in Table 2. From Table 2, it is recognized that the degradation ratio of triolein can be further increased by incorporating niobium oxide into titanium oxide.

EXAMPLES 14 to 16

Experiments of Adding Other Metal Oxide Impurity

A film containing titanium oxide as a primary component was coated on a glass plate under the same atmosphere during sputtering as in Example 4, employing three metallic targets, in which either aluminum, iron or nickel was added to metallic titanium. Table 2 shows results obtained by evaluating the photocatalytic films of the samples that were prepared by heat treating the coated films under the same oxidizing atmosphere as in Example 4. From these results, it has been found that when aluminum, iron or nickel is contained in the titanium oxide film as minor impurity, the photocatalytic activity can be slightly increased.

TABLE 2

| Example | Target | $O_2$ in the atmosphere during sputtering (%) | Sheet resistance immediately after coating ($\Omega/\square$) | Post-heat Treatment Atmosphere | Sheet Resistance ($\Omega/\square$) | Photocatalytic activity Degradation ratio of triolein (%) |
|---|---|---|---|---|---|---|
| (Example) | | | | | | |
| 12 | TiNbO$_y$ | 10 | $8 \times 10^{12}$ | inert | $1 \times 10^{11}$ | 65 |
| 13 | TiNbO$_y$ | 4 | $7 \times 10^{8}$ | oxidative | $7 \times 10^{10}$ | 63 |
| 14 | TiAl | 70 | $2 \times 10^{9}$ | oxidative | $1 \times 10^{11}$ | 68 |
| 15 | TiFe | 70 | $2 \times 10^{9}$ | oxidative | $2 \times 10^{11}$ | 69 |
| 16 | TiNi | 70 | $2 \times 10^{9}$ | oxidative | $1 \times 10^{11}$ | 67 |

EXAMPLE 17

Experiments on Laminated Structures

An underlying film of niobium oxide was coated on a glass plate so as to be 10 nm in thick. After that, a titanium oxide film with a thickness of 250 nm was coated on the niobium oxide film by employing metallic titanium as the target and reactive sputtering under the atmosphere of 90% by volume of oxygen, as in Example 3. The photocatalytic film having this laminated structure was heat treated under the air atmosphere at 250° C. for 1 hour. The resulting photocatalytic film had a degradation ratio of triolein of 65%, which is higher than that of Example 3, as indicated in Table 3.

TABLE 3

| Example | Target | Laminated structure | Sheet resistance immediately after coating ($\Omega/\square$) | Heat Treatment Atmosphere | Sheet Resistance ($\Omega/\square$) | Photocatalytic activity Degradation ratio of triolein (%) |
|---|---|---|---|---|---|---|
| (Example) | | | | | | |
| 17 | Nb/Ti | $Nb_2O_5/TiO_2$ | $2 \times 10^{14}$ | inert | $2 \times 10^{12}$ | 65 |

EXAMPLE 18

For films having the laminated structure coated on a glass plate in Example 17, effects on the photocatalytic activity of the heating temperature of the heat treatment under the insert atmosphere were examined. In the case that the treating time was one hour and the temperatures were 100° C., 200° C., 300° C., and 450° C., results are shown in Table 4, as Samples 18A, 18B, 18C, 18D and 18E, along with the results of the sample of Example 17 for comparison. The results of Table 4 indicate that the degradation ratio of triolein can be slightly increased by employing the laminated structure of niobium oxide and titanium oxide films. Although this reason is not clear, it is believed that the niobium diffused and entered from the interface of the titanium oxide film by the heat treatment took an optimal coordination state in the crystal of titanium dioxide.

TABLE 4

| Example | Laminated structure | Sheet resistance immediately after coating ($\Omega/\square$) | Heat Treatment for 1 hour Atmosphere | Temperature (° C.) | Sheet resistance ($\Omega/\square$) | Photocatalytic activity Degradation ratio of triolein (%) |
|---|---|---|---|---|---|---|
| (Example) | | | | | | |
| Sample 18A | $Nb_2O_5/TiO_2$ | $2 \times 10^{14}$ | not applied | | $2 \times 10^{14}$ | 20 |
| Sample 18B | $Nb_2O_5/TiO_2$ | $2 \times 10^{14}$ | inert | 100 | $1 \times 10^{14}$ | 22 |
| Sample 18C | $Nb_2O_5/TiO_2$ | $2 \times 10^{14}$ | inert | 200 | $5 \times 10^{12}$ | 53 |
| Sample 17 | $Nb_2O_5/TiO_2$ | $2 \times 10^{14}$ | inert | 250 | $1 \times 10^{12}$ | 68 |
| Sample 18D | $Nb_2O_5/TiO_2$ | $2 \times 10^{14}$ | inert | 300 | $9 \times 10^{9}$ | 63 |
| Sample 18E | $Nb_2O_5/TiO_2$ | $2 \times 10^{14}$ | inert | 450 | $1 \times 10^{8}$ | 27 |

From the explanation described above, it is clear that the sheet resistance of the titanium oxide film is associated with the oxygen-defect state and the crystallinity, which significantly contribute to its photocatalytic activity. It is believed that incorporation of added impurity into the crystalline film of titanium oxide can change its energy level (band structure), thereby leading to increasing its photocatalytic activity.

Industrial Applicability

The photocatalytic film of titanium oxide coated on a substrate by a sputtering process according to the present invention has a sheet resistance controlled in the range of $10^9$ to $10^{13}$ $\Omega/\square$, and therefore high photocatalytic activity.

In addition, it is possible to increase the surface hardness of the film by carrying out the controlling of the sheet resistance by the crystallization of the film associated with the heat treatment.

Furthermore, it is possible to increase the photocatalytic activity by adding a small amount of impurity to the titanium oxide photocatalytic film. Also, it is possible to increase the photocatalytic activity by coating an underlying film of the titanium oxide photocatalytic film.

The method of the present invention comprises the steps of coating a photocatalytic film having titanium oxide as a primary component on a substrate by a sputtering process, and subjecting the film to heat treatment after coating. According to the method of the present invention, the film obtained by the coating step can have its sheet resistance controlled in a pre-determined range, so that the oxygen-defect state in the film can be controlled and a substrate with photocatalytic film having high photocatalytic activity can be produced with good reproductivity.

In addition, since a photocatalytic film can be coated without heating a substrate, it is unnecessary to provide sputtered-film-forming equipment with large heating and vacuum mechanism, and coating can e carried out economically.

What is claimed is:

1. A substrate with photocatalytic film comprising a substrate and a photocatalytic film coated on the substrate, wherein said photocatalytic film contains titanium oxide as a primary component, in the case that a sheet resistance of the photocatalytic film after coating is more than $10^{13}$ $\Omega/\square$, said photocatalytic film is subjected to heat treatment in an inert or reducing atmosphere so that the oxygen deficiency in the photocatalytic film is increased, and in the case that a sheet resistance of the photocatalytic film after coating is less than $10^9$ $\Omega/\square$, said photocatalytic film is subjected to heat treatment in an oxidizing atmosphere so that the oxygen deficiency in the photocatalytic film is decreased, thereby said photocatalytic film has a sheet resistance of $10^9$ to $10^{13}$ $\Omega/\square$, and wherein said inert atmosphere is a rare gas atmosphere, or a vacuumed atmosphere; the reducing atmosphere is an atmosphere containing hydrogen gas; and said oxidizing atmosphere is an oxygen containing atmosphere such as air containing atmosphere or ozone containing atmosphere, and wherein niobium oxide film or nickel oxide film is provided as an underlying film between the substrate and the photocatalytic film.

2. The substrate with photocatalytic film according to claim 1, wherein the photocatalytic film contains, as a by-component, any one of niobium oxide, aluminum oxide, iron oxide, and nickel oxide.

3. A substrate with photocatalytic film comprising a substrate and a photocatalytic film coated on the substrate, wherein said photocatalytic film contains titanium oxide as a primary component, in the case that a sheet resistance of the photocatalytic film after coating is more than $10^{13}$ $\Omega/\square$, said photocatalytic film is subjected to heal treatment in an inert or reducing atmosphere, and in the case that a sheet resistance of the photocatalytic film after coating is less than $10^9$ $\Omega/\square$, said photocatalytic film is subjected to heat treatment in an oxidizing atmosphere, thereby said photocatalytic film has a sheet resistance of $10^9$ to $10^{13}$ $\Omega/\square$, and wherein said inert atmosphere is a rare gas atmosphere or a vacuumed atmosphere; the reducing atmosphere is an atmosphere containing hydrogen gas; and said oxidizing atmosphere is an oxygen containing atmosphere such as air containing atmosphere or ozone containing atmosphere, wherein any one of niobium oxide film, aluminum oxide film, iron oxide film, and nickel oxide film is provided as an underlying film between the substrate and the photocatalytic film, and wherein the underlying film is a niobium oxide film.

4. The substrate with photocatalytic film according to claim 3, wherein the photocatalytic film contains, as a by-component, any one of niobium oxide, aluminum oxide, iron oxide, and nickel oxide.

5. The substrate with photocatalytic film according to claim 1, wherein the substrate is glass.

6. The substrate with photocatalytic film according to claim 2, wherein the substrate is glass.

7. The substrate with photocatalytic film according to claim 3, wherein the substrate is glass.

8. The substrate with photocatalytic film according to claim 4, wherein the substrate is glass.

* * * * *